United States Patent
Shen et al.

(10) Patent No.: US 11,031,548 B2
(45) Date of Patent: Jun. 8, 2021

(54) REDUCE INTERMIXING ON MTJ SIDEWALL BY OXIDATION

(71) Applicant: Headway Technologies, Inc., Milpitas, CA (US)

(72) Inventors: Dongna Shen, San Jose, CA (US); Yi Yang, Fremont, CA (US); Sahil Patel, Sunnyvale, CA (US); Vignesh Sundar, Fremont, CA (US); Yu-Jen Wang, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 16/672,981

(22) Filed: Nov. 4, 2019

(65) Prior Publication Data

US 2021/0135097 A1     May 6, 2021

(51) Int. Cl.
    *H01L 43/12*     (2006.01)
    *H01L 43/02*     (2006.01)

(52) U.S. Cl.
    CPC .............. *H01L 43/12* (2013.01); *H01L 43/02* (2013.01)

(58) Field of Classification Search
    CPC ................................ H01L 43/12; H01L 43/02
    See application file for complete search history.

(56) References Cited

U.S. PATENT DOCUMENTS

| 8,045,299 B2 | 10/2011 | Fontana, Jr. et al. |
| 8,330,196 B2 | 12/2012 | Marukame et al. |
| 8,828,742 B2 | 9/2014 | Iba |
| 9,647,203 B2 | 5/2017 | Kitagawa et al. |
| 9,876,165 B2 | 1/2018 | Kim et al. |
| 9,960,347 B2 | 5/2018 | Annunziata et al. |
| 2018/0033957 A1 | 2/2018 | Zhang et al. |
| 2020/0091411 A1* | 3/2020 | Sonoda ................... H01L 43/10 |
| 2020/0303452 A1* | 9/2020 | Houssameddine ... H01L 27/224 |

\* cited by examiner

*Primary Examiner* — Errol V Fernandes
(74) *Attorney, Agent, or Firm* — Saile Ackerman LLC; Stephen B. Ackerman; Rosemary L. S. Pike

(57) ABSTRACT

A method for fabricating a magnetic tunneling junction (MTJ) structure is described. A MTJ film stack is deposited on a bottom electrode on a substrate. The MTJ film stack is first ion beam etched (IBE) using a first angle and a first energy to form a MTJ device wherein conductive re-deposition forms on sidewalls of the MTJ device. Thereafter, the conductive re-deposition is oxidized. Thereafter, the MTJ device is second ion beam etched (IBE) at a second angle and a second energy to remove oxidized re-deposition.

19 Claims, 4 Drawing Sheets

REDUCE INTERMIXING ON MTJ SIDEWALL BY OXIDATION

TECHNICAL FIELD

This application relates to the general field of magnetic tunneling junctions (MTJ) and, more particularly, to etching methods for forming sub 100 nm MTJ structures.

BACKGROUND

In the fabrication of Magnetic Tunneling Junctions (MTJ), etching is performed to make the electric isolation between MTJ junctions. Ion beam etching (IBE) has become more often used for MTJ etching due to chemical damage free MTJ sidewalls as compared with typical reactive ion etching (RIE), such as using Methanol, CO, or $NH_3$. However, the biggest drawback of MTJ IBE is metal re-deposition which will be a shorting path of the tunnel barrier layer. In general, the MTJ IBE process consists of multiple steps. The first step is the main etch using higher energy and lower angle for the purpose of faster etching rate and end point detection. This step will create more or less metal re-deposited from the tunnel junction layer and the bottom electrode layer during etching, depending on the ion beam etching angle. A larger angle results in less re-deposition. The second step is trimming or cleaning using lower energy and a higher angle beam to remove re-deposition. However, the high angle step will easily cause intermixing between the re-deposition and the MTJ by knocking the re-deposited metal into the MTJ sidewall. Intermixing will be the second biggest drawback of MTJ IBE.

A higher angle (more vertical to the sidewall) and stronger beam energy will lead to more intermixing. If the first two steps still can't avoid shorting the barrier layer, an optional third oxidation step can be utilized to further improve barrier shorting. However, this oxidation will also oxidize the MTJ itself, which in addition to the re-deposition and intermixing, will usually degrade the MTJ performance. Another solution to reduce re-deposition is a different integration method. This method requires thick and small bottom electrodes (smaller than the MTJ). The re-deposition can be highly reduced by increasing the over-etch amount. However, the small and thick bottom electrodes will increase the difficulty of integration because of the extra thickness of the whole layer and the requirement for precise lithography alignment between layers.

Several patents teach oxidizing re-deposition, including U.S. Patent Application 2018/0033957 (Zhang et al) and U.S. Pat. No. 8,828,742 (Iba), U.S. Pat. No. 9,647,203 (Kitagawa et al), U.S. Pat. No. 8,045,299 (Fontana, Jr. et al), and U.S. Pat. No. 8,330,196 (Marukame et al). All of these references are different from the present disclosure.

SUMMARY

It is an object of the present disclosure to provide an improved method of forming MTJ structures minimizing intermixing between re-deposited metal materials and MTJ sidewalls.

Another object of the present disclosure is to provide a method of forming MTJ structures minimizing intermixing between re-deposited metal materials and MTJ sidewalls by oxidizing re-deposited materials before removing them.

In accordance with the objectives of the present disclosure, a method for fabricating a magnetic tunneling junction (MTJ) structure is achieved. A MTJ film stack is deposited on a bottom electrode on a substrate. The MTJ film stack is first ion beam etched (IBE) using a first angle and a first energy to form a MTJ device wherein conductive re-deposition forms on sidewalls of the MTJ device. Thereafter, the conductive re-deposition is oxidized. Thereafter, the MTJ device is second ion beam etched (IBE) at a second angle and a second energy to remove oxidized re-deposition.

BRIEF DESCRIPTION OF THE DRAWINGS

In the accompanying drawings forming a material part of this description, there is shown.

DETAILED DESCRIPTION

Figure 1A:
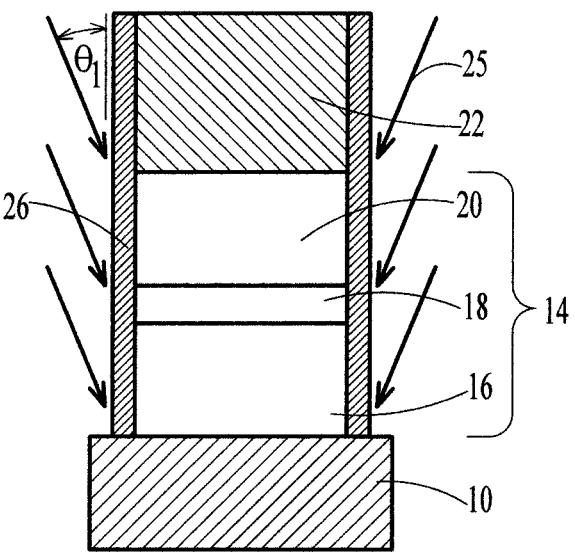
FIGS. 1A-1C are cross-sectional representations of steps in the prior art.
Figure 1B:
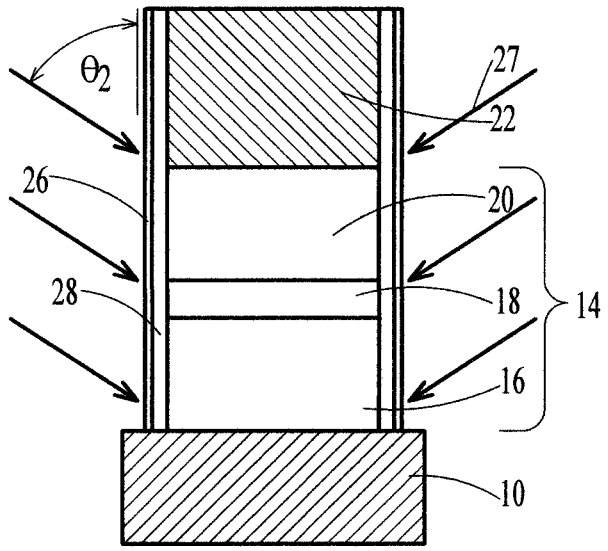
Figure 1C:
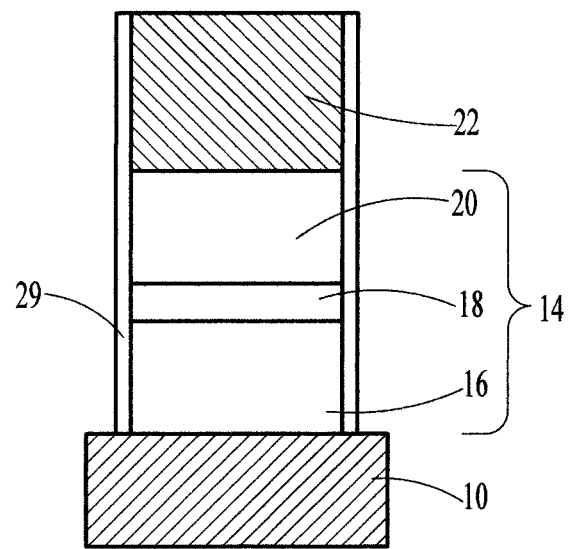

A conventional MTJ IBE fabrication process is illustrated in FIGS. 1A-1C. FIG. 1A illustrates a bottom electrode 10 having a stack 14 of MTJ layers deposited thereon. These layers include seed and pinned layer 16, tunnel barrier layer 18, such as MgO, and free layer, capping layer, and any other layers 20. Hard mask 22 has been formed on the MTJ stack and patterned as shown. A low angle main etching is performed to pattern the MTJ structure 14. IBE 25 has a low angle with respect to a normal to the top surface of the MTJ device. Typically, the angle 191 is between about 0 and 50 degrees, depending on equipment used. This etching process creates metal re-deposition 26 from the MTJ 14 and bottom electrode 10 on the sidewalls of the MTJ structure 14 and hard mask 22.

Figure 2A:
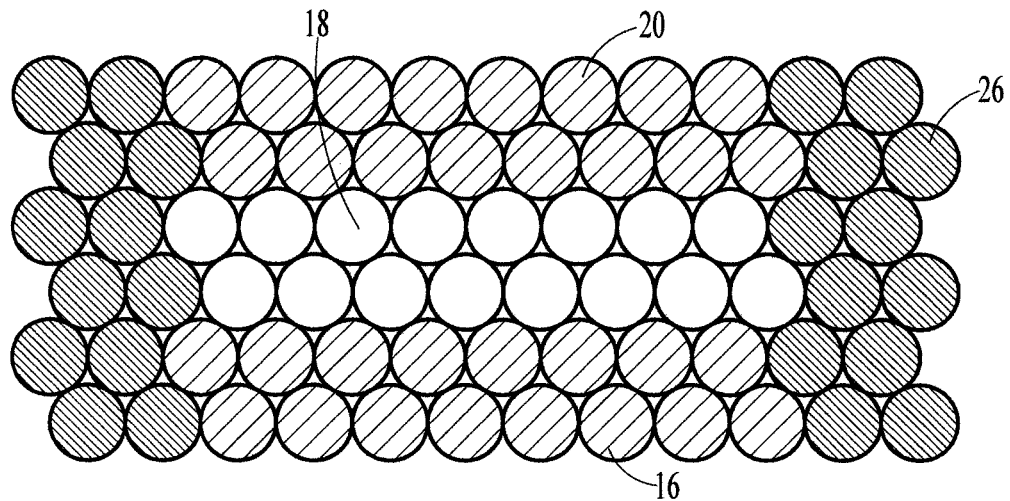
FIGS. 2A-2C are close up representations of sidewall intermixing in the prior art.
Figure 2B:
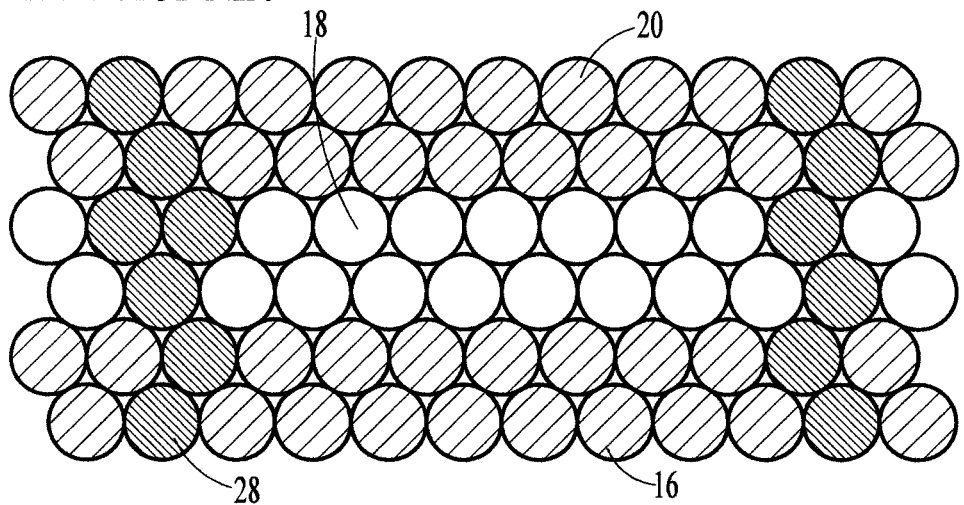
Figure 2C:
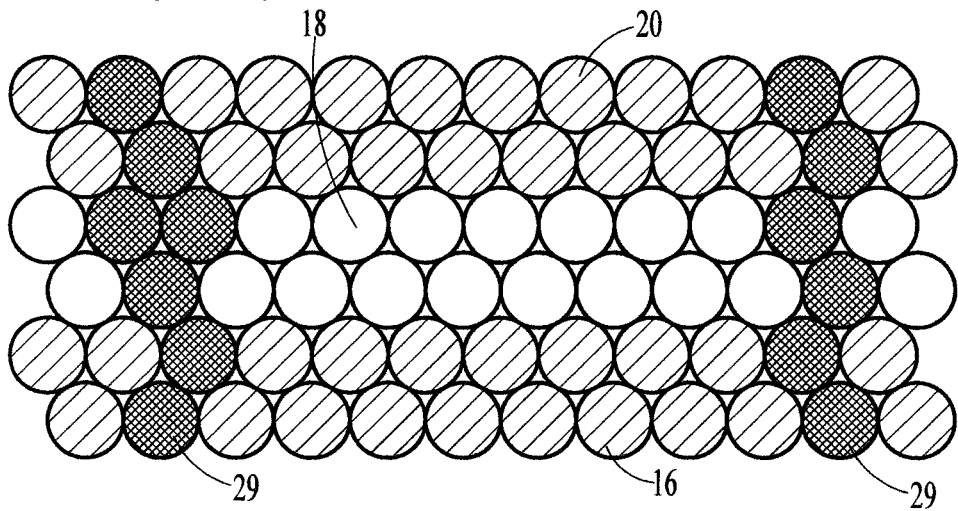

FIGS. 2A-2C are a close-up representation of the MTJ sidewall during the process illustrated in FIGS. 1A-1C. FIG. 2A illustrates a portion of pinned layer 16, barrier layer 18, and free layer 20. For example, pinned and free layers 16 and 20 may both comprise CoFeB. Barrier layer may comprise MgO. Metal re-deposition 26 is illustrated on the sidewalls of all three of these layers.

Now, in FIG. 1B, a high angle IBE trimming or cleaning step 27 is performed with a high angle θ2 of between about 50 and 90, also dependent on equipment used. This step partially or completely removes the metal re-deposition 26, but also creates intermixing by "knock-on" of re-deposited metals into the MTJ sidewall. Since the ion beam is initially generated as a plasma and accelerated using grids and directed at the wafer (and neutralized along the way), the beam still possesses considerable energy when it reaches the wafer surface. Depending on the energy of the incoming species as well as the material that is present on the surface, a situation could occur where some atoms on the surface of the wafer get knocked further into the film rather than being sputtered off. FIG. 2B illustrates some of the re-deposited metal atoms 28 that have been forced into the interior of each of the MTJ layers.

An oxidation step, illustrated in FIG. 1C, can help to recover some MTJ performance as any remaining re-deposited metals 26 are oxidized 29 so they are no longer conductive. However, as shown in FIG. 1C, the oxidized re-deposition 29, is still intermixed in the MTJ sidewall. The Magnetic materials on the sidewall are also to some degree oxidized at this step, and get degraded or damaged. The subsequent high temperature processes will continue to degrade MTJ device performance.

The process of the present disclosure performs oxidation right after the main etching step. Changing the metal re-deposition to metal oxide before removing it using high angle trimming will help to highly reduce intermixing while removing the re-deposition using high angle trimming. The conventional process flow was always main etch, then trimming, oxidation, and finally encapsulation. Surprisingly, performing oxidation right after the main etching step and before trimming results in a great improvement in MTJ device performance.

Figure 3A:
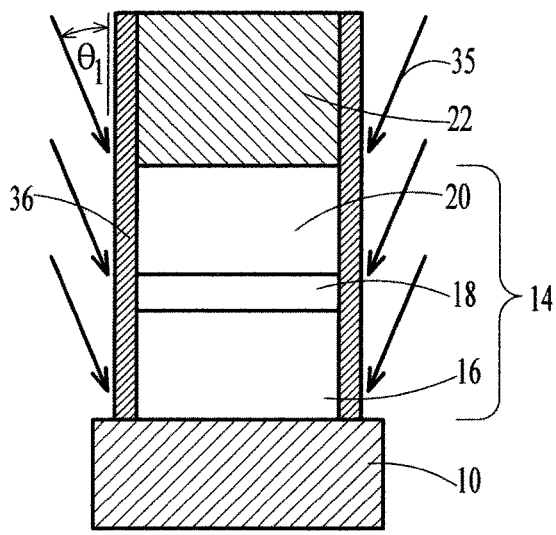
FIGS. 3A-3D are cross-sectional representations of steps in a preferred embodiment of the present disclosure.

The new MTJ IBE fabrication process of the present disclosure is illustrated in FIGS. 3A-3D. FIG. 3A illustrates a bottom electrode 10 having a stack 14 of MTJ layers deposited thereon. These layers include seed and pinned layer 16, tunnel barrier layer 18, such as MgO, and free layer, capping layer, and any other layers 20. Hard mask 22 has been formed on the MTJ stack and patterned as shown. A low angle main etching is performed to pattern the MTJ structure 14. IBE 35 has a low angle with respect to a normal to the top surface of the MTJ device. Preferably, the angle θ1 is between about 0 and 50 degrees and high energy of between about 150 eV and 800 eV is applied. This etching process creates metal re-deposition 36 from the MTJ 14 and bottom electrode 10 on the sidewalls of the MTJ structure 14 and hard mask 22. Alternatively, reactive ion etching (RIE) could be used for the main etch step. The chemical composition of the re-deposition might be different because RIE will introduce other elements from the etching gas.

Figure 3B:
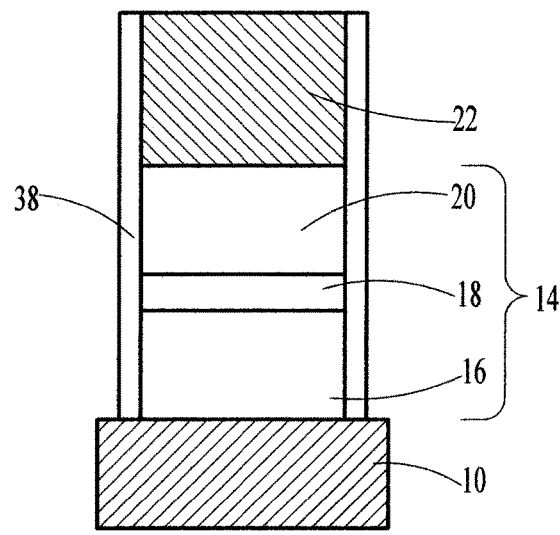
Figure 3C:
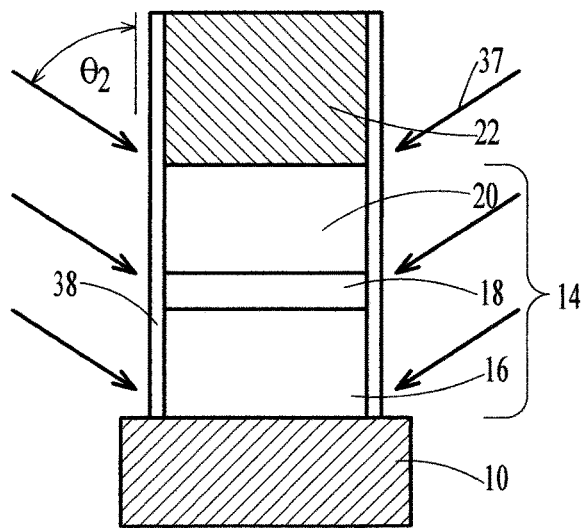
Figure 4A:
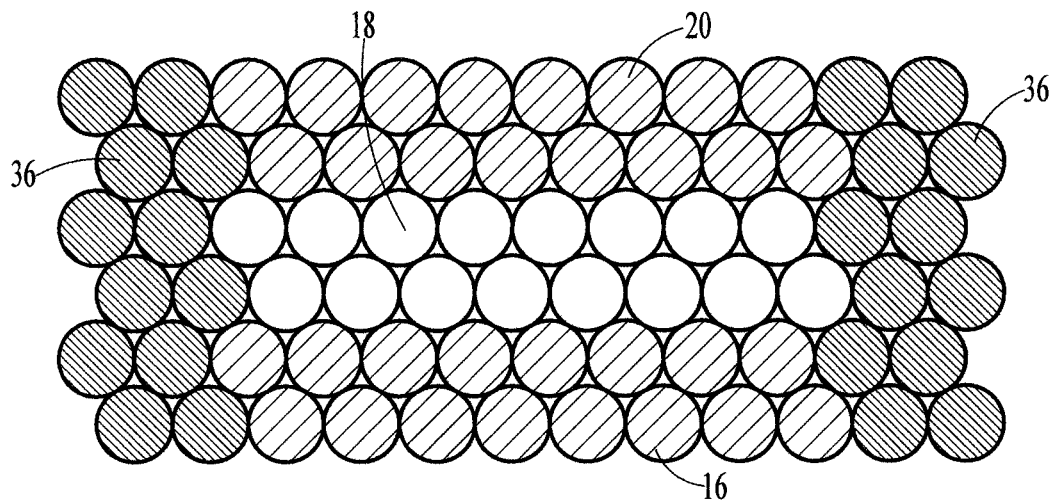
FIGS. 4A-4C are close up representations of sidewall intermixing in the preferred embodiment of the present disclosure.
Figure 4B:
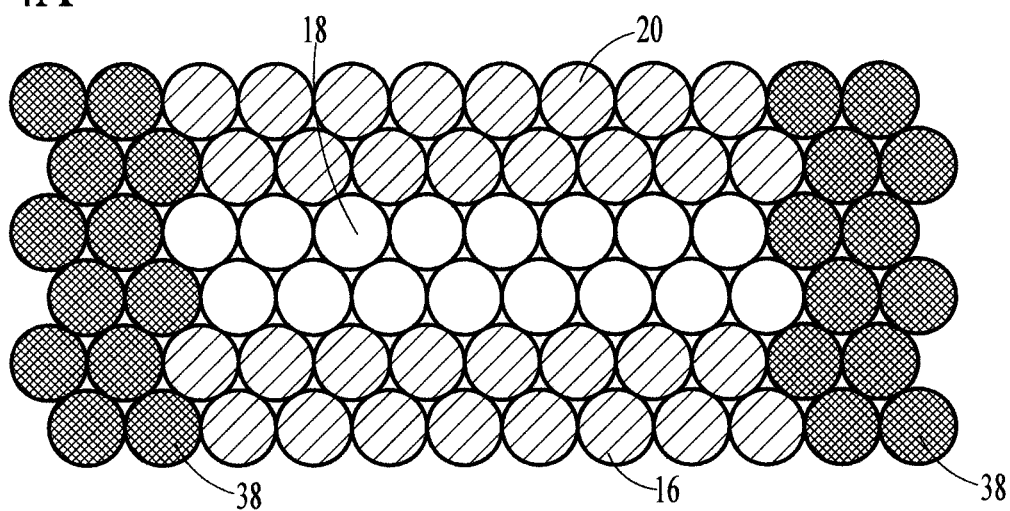
Figure 4C:
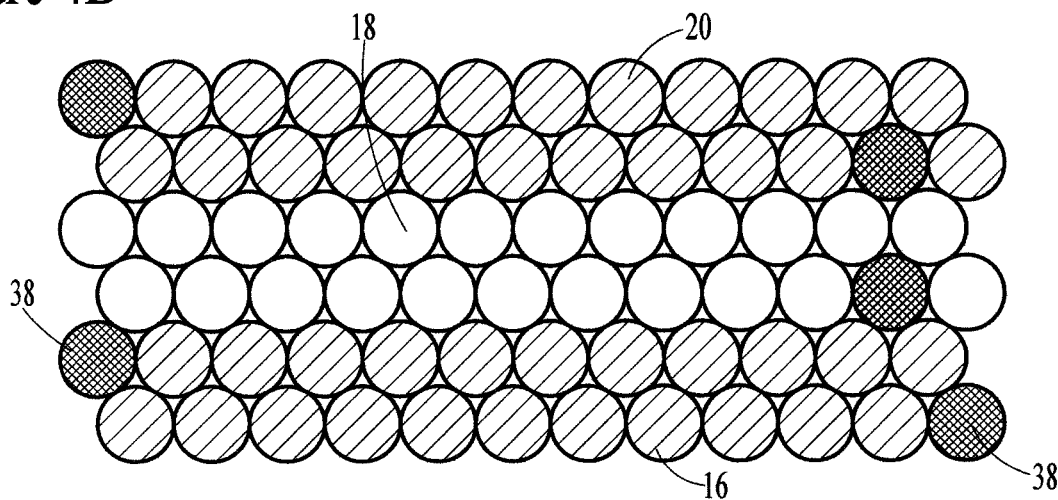

FIGS. 4A-4C are a close-up representations of the MTJ sidewall during the process illustrated in FIGS. 3A-3C. FIG. 4A illustrates a portion of pinned layer 16, barrier layer 18, and free layer 20. For example, pinned and free layers 16 and 20 may both comprise CoFeB. Barrier layer may comprise MgO. Metal re-deposition 36 is illustrated on the sidewalls of all three of these layers.

Now, in FIG. 3B, an oxidation is performed to oxidize the metal re-deposition 36. After oxidation, the metal re-deposition 36 has been changed to an insulating oxide 38. Oxidation can be done by flowing $O_2$, $O_3$, or an inert gas diluted $O_2$ or $O_3$, by exposing the wafer to air, by $O_2$ or $O_3$ plasma, or an inert gas diluted by $O_2$ or $O_3$ plasma, or by flowing $O_2$ or $O_3$ during the first IBE step. Flowing $O_2$ is preferred because of its mild oxidation and controllability.

FIG. 4B shows the re-deposited metal 36 on the sidewalls has been transformed to oxide 38. Optionally, the oxidation step may be performed repeatedly until all the re-deposited metal has been oxidized.

Now, as shown in FIG. 3C, a high angle IBE trimming or cleaning step 37 is performed with a high angle 82 of between about 50 and 90. This step partially or completely removes the oxidized re-deposition 38. This trimming step may have a higher angle and/or lower energy than the first etch step 35. Preferably, the energy will be between about 50 eV and 200 eV. This step might create some intermixing by "knock-on" of re-deposited oxides into the MTJ sidewall. FIG. 4C illustrates the oxidized atoms 38 that have been forced into the interior of each of the MTJ layers. In this case, fewer atoms are forced into the interior of the MTJ layers than in the case of the metal atoms, illustrated in FIG. 2C. It is possible that heavy metal atoms are easier to be knocked into the sidewall than the oxidized atoms. The oxide of a heavy metal usually has a larger molecule and lower mass density than the heavy metal itself which might make it more difficult to be forced into the interior of the MTJ layers.

When the etching rate on the sidewall is faster than the re-deposition rate on sidewall, there will be no re-deposition (unless it is knock-on materials). The etching rate is mainly dependent on the materials and pan angle for a given ion beam energy. For most materials, the highest etching rate was achieved when the penetration angle ranges between 40 and 50 degrees. Below this angle, the etching rate on the sidewall is slower than that on the substrate or slower than the re-deposition rate on the sidewall, so it will create more re-deposition. Above this angle, the etching rate will be faster on the sidewall than on the substrate or faster than the re-deposition rate on the sidewall. Thus, there will be no re-deposition, unless there is knock-on. This assumes the sidewall is vertical; the pan angle on the substrate and the angle on the sidewall should be 90 degrees.

Figure 3D:
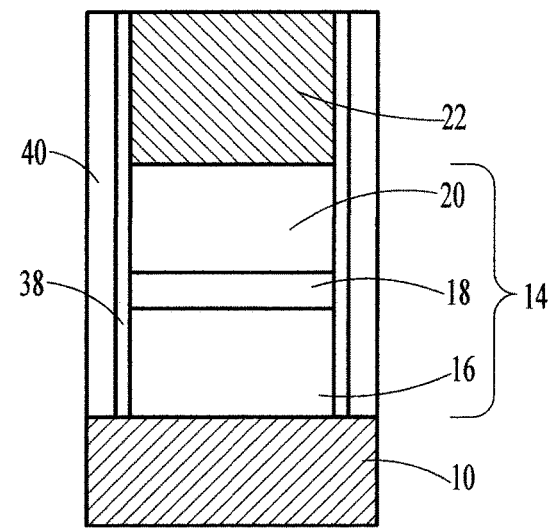

Optionally, an additional oxidation step may be performed after the trimming step in case not all the metal was oxidized in the first oxidation step. In the first oxidation step, we want the process to be mild because a strong oxidation process may oxidize or damage the MTJ itself. In this additional oxidation treatment step, the sidewall is exposed to either pure oxygen or ozone gases, an oxygen/ozone plasma, or an oxygen/ozone radical shower, This step might be included in the process flow to completely eliminate shorted devices across the entire wafer. Finally, the MTJ device is encapsulated in dielectric 40, and the hard mask which now forms the top electrode 22 is exposed, as shown in FIG. 3D.

The process of the present disclosure adds an oxidation step in between a low angle IBE main etching and high angle IBE trimming of the MTJ structure. As a result of this process, Hc was improved up to 25% and DRR was improved up to 12%. Additionally, low tail and DRR variation improvement was seen, especially for small devices (<60 nm).

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method for magnetic tunnel junction (MTJ) fabrication comprising:
   depositing a MTJ film stack on a bottom electrode on a substrate;
   first etching said MTJ film stack to form a MTJ device wherein conductive re-deposition forms on sidewalls of said MTJ device;
   thereafter first oxidizing said conductive re-deposition;
   thereafter second etching said MTJ device to remove oxidized said re-deposition; and
   thereafter second oxidizing any remaining conductive re-deposition on said sidewalls of said MTJ device.

2. The method according to claim 1 wherein said MTJ film stack comprises adhesion layer(s), seed layer(s), pinned layer(s), tunnel barrier layer(s), free layer(s), oxide or metallic capping layers, and hard mask layer(s).

3. The method according to claim 1 wherein said first etching comprises reactive ion etching and said second etching comprises ion beam etching.

4. The method according to claim 1 wherein said first etching comprises ion beam etching at a first angle of between 0° to 50° with respect to a normal line to a top surface of said MTJ film stack and a first energy of between about 150 and 800 eV.

5. The method according to claim 1 wherein said first oxidizing said conductive re-deposition comprises one of: flowing $O_2$, $O_3$, or an inert gas diluted $O_2$ or $O_3$, exposing the wafer to air, $O_2$ or $O_3$ plasma, or an inert gas diluted by $O_2$ or $O_3$ plasma, or flowing $O_2$ or $O_3$ during said first etching.

6. The method according to claim 1 wherein said first oxidizing step is repeated until all of said conductive re-deposition is oxidized.

7. The method according to claim 4 where said second etching is an ion beam etching at a second angle of between about 50° to 90° with respect to a normal line to a top surface of said MTJ film stack and a second energy of between about 50 and 200 eV.

8. The method according to claim 1 wherein said second oxidizing comprises one of: flowing $O_2$, O3, or an inert gas diluted $O_2$ or O3, exposing the wafer to air, $O_2$ or $O_3$ plasma, or an inert gas diluted by $O_2$ or $O_3$ plasma, or flowing $O_2$ or $O_3$ during said first etching step.

9. The method according to claim 1 after said second oxidizing further comprising dielectric encapsulating said MTJ devices without exposure to atmosphere.

10. A method for magnetic tunnel junction (MTJ) fabrication comprising:
   depositing a MTJ film stack on a bottom electrode on a substrate;
   first ion beam etching (IBE) said MTJ film stack using a first angle and a first energy to form a MTJ device wherein conductive re-deposition forms on sidewalls of said MTJ device;
   thereafter first oxidizing said conductive re-deposition;
   thereafter second ion beam etching (IBE) said MTJ device at a second angle and a second energy to remove oxidized said re-deposition; and
   thereafter second oxidizing any remaining conductive re-deposition on said sidewalls of said MTJ device.

11. The method according to claim 10 wherein said MTJ film stack comprises adhesion layer(s), seed layer(s), pinned layer(s), tunnel barrier layer(s), free layer(s), oxide or metallic capping layers, and hard mask layer(s).

12. The method according to claim 10 wherein said first etching comprises ion beam etching at a first angle of between 0° to 50° with respect to a normal line to a top surface of said MTJ film stack and a first energy of between about 150 and 800 eV.

13. The method according to claim 10 wherein said first oxidizing said conductive re-deposition comprises one of: flowing $O_2$, $O_3$, or an inert gas diluted $O_2$ or $O_3$, exposing the wafer to air, $O_2$ or $O_3$ plasma, or an inert gas diluted by $O_2$ or $O_3$ plasma, or flowing $O_2$ or $O_3$ during said first etching.

14. The method according to claim 10 wherein said first oxidizing step is repeated until all of said conductive re-deposition is oxidized.

15. The method according to claim 10 where said second etching is an ion beam etching at a second angle of between about 50° to 90° with respect to a normal line to a top surface of said MTJ film stack and a second energy of between about 50 and 200 eV.

16. The method according to claim 10 wherein said second angle is equal to or higher than said first angle and/or said second energy is equal to or lower than said first energy.

17. The method according to claim 10 wherein said second oxidizing comprises one of: flowing $O_2$, $O_3$, or an inert gas diluted $O_2$ or $O_3$, exposing the wafer to air, $O_2$ or $O_3$ plasma, or an inert gas diluted by $O_2$ or $O_3$ plasma, or flowing $O_2$ or $O_3$ during said first etching step.

18. The method according to claim 10 after said second oxidizing further comprising dielectric encapsulating said MTJ devices without exposure to atmosphere.

19. A method for magnetic tunnel junction (MTJ) fabrication comprising:
   depositing a MTJ film stack on a bottom electrode on a substrate;
   first ion beam etching (IBE) said MTJ film stack using a first angle and a first energy to form a MTJ device wherein conductive re-deposition forms on sidewalls of said MTJ device;
   oxidizing said conductive re-deposition by flowing $O_2$ during or after said first ion beam etching; and
   thereafter second ion beam etching (IBE) said MTJ device at a second angle and a second energy to remove oxidized said re-deposition wherein said second angle is equal to or higher than said first angle and/or said second energy is equal to or lower than said first energy; and
   thereafter performing an additional oxidation treatment to oxidize any remaining conductive re-deposition on said sidewalls of said MTJ device.

* * * * *